United States Patent
Corsi et al.

[11] Patent Number: 6,104,054
[45] Date of Patent: Aug. 15, 2000

[54] SPACE-EFFICIENT LAYOUT METHOD TO REDUCE THE EFFECT OF SUBSTRATE CAPACITANCE IN DIELECTRICALLY ISOLATED PROCESS TECHNOLOGIES

[75] Inventors: Marco Corsi, Plano; Stephen W. Milam, Carrollton; Gregory M. Cooley, Dallas, all of Tex.

[73] Assignee: Texas Instruments Incorporated, Dallas, Tex.

[21] Appl. No.: 09/306,182

[22] Filed: May 6, 1999

Related U.S. Application Data

[60] Provisional application No. 60/085,358, May 13, 1998.

[51] Int. Cl.⁷ .................................................. H01L 27/108
[52] U.S. Cl. ........................ 257/306; 257/301; 257/304; 257/306; 257/311
[58] Field of Search .................................. 257/301, 304, 257/306, 311

[56] References Cited

U.S. PATENT DOCUMENTS

| | | | |
|---|---|---|---|
| 5,005,072 | 4/1991 | Gonzalez | 357/23.6 |
| 5,394,000 | 2/1995 | Elul et al. | 257/301 |
| 5,686,339 | 11/1997 | Lee et al. | 437/52 |
| 5,804,853 | 9/1998 | Cronin et al. | 257/309 |
| 5,952,687 | 9/1999 | Kawakubo et al. | 257/296 |
| 5,962,885 | 10/1999 | Fischer et al. | 257/306 |
| 5,977,580 | 11/1999 | Yoon | 257/306 |
| 5,981,993 | 11/1999 | Cho | 257/311 |
| 6,008,515 | 12/1999 | Hsia et al. | 257/309 |
| 6,040,596 | 3/2000 | Choi et al. | 257/306 |

FOREIGN PATENT DOCUMENTS

| | | | |
|---|---|---|---|
| 405251636 | 9/1993 | Japan | 257/306 |
| 406005806 | 9/1993 | Japan | 257/306 |

*Primary Examiner*—David Hardy
*Assistant Examiner*—Edgardo Ortiz
*Attorney, Agent, or Firm*—Jacqueline J. Garner; W. James Brady, III; Frederick J. Telecky, Jr.

[57] ABSTRACT

A method for reducing the parasitic capacitance and capacitive coupling of nodes (106) in a dielectrically isolated integrated circuit (100) using layout changes. A separate area of floating silicon (110) is created adjacent two or more dielectrically isolated nodes (106). The two or more nodes (106) are chosen that "slew together" (i.e., nodes that are required to change by the same voltage at the same time). The area of floating silicon (110) is created by placing an additional trench (112) around both of the dielectrically isolated nodes (106).

11 Claims, 4 Drawing Sheets

SPACE-EFFICIENT LAYOUT METHOD TO REDUCE THE EFFECT OF SUBSTRATE CAPACITANCE IN DIELECTRICALLY ISOLATED PROCESS TECHNOLOGIES

This application claims priority under 35 USC §119(e)(1) of provisional application number 60/085,358 filed May 13, 1998.

FIELD OF THE INVENTION

The invention is generally related to the field of dielectrically isolated semiconductor process technology and more specifically to reducing the parasitic capacitances which degrade the performance of integrated circuits.

BACKGROUND OF THE INVENTION

All integrated circuits are subject to parasitic capacitances and capacitive coupling. Parasitic substrate capacitance and capacitive coupling can impede the operating speed or slew rate of the circuit. The slew rate of each node of the circuit is determined by the current available to charge a node's capacitance divided by the capacitance at that node. For a circuit like an operational amplifier (Op Amp), the slew rate for the circuit is approximately equal to the slowest of the slew rates of the nodes in the signal path divided by the voltage gain from the output back to that node.

Some circuits, such as Op Amps, have large power supply voltages (~30V) and speed requirements. In order to obtain tighter packing of devices for such circuits, it is advantageous to form the circuit on a dielectrically isolated device layer. This is sometimes referred to as silicon-on-insulator or SOI. SOI replaces the large junctions of P- and N-type material with small regions of insulating material having high breakdown voltages. An SOI substrate comprises a carrier wafer substrate separated from the active silicon layer by a buried oxide layer. The decrease in silicon area reduces the area dependent capacitances, wiring capacitances, and distance related resistances. However, parasitic capacitances still exist which affect the slew rate, stability and maximum operating frequency of the circuits.

One way to improve the slew rate of an Op Amp on an SOI substrate is to reduce the capacitance at the restricting node of the amplifier. Prior art trench isolated technologies have relied on a single trench for isolation. Junction isolated processes rely on spacing between devices, guard rings and careful interconnect to avoid capacitive coupling, but these issues do not address substrate capacitance. A prior art trench isolated structure is shown in FIG. 1. In a dielectrically isolated technology, there exists a parasitic capacitance 10 from the collector of a bipolar transistor of transistor region 12 across the buried oxide 20 to the carrier wafer substrate 14 and another parasitic capacitance 16 to the floating (not electrically connected) silicon 18 across the dielectric 20 from the collector region. The capacitance between a component and the carrier substrate is primarily a function of the trench-enclosed area and the dielectric thickness. Thus, the process technology must be altered in order to have a significant effect on the parasitic capacitance of this structure. However, the process technology is often developed by balancing the needs of various circuits. Therefore, a method for reducing the parasitic capacitance and capacitive coupling that does not require changes to the process technology is desired.

SUMMARY OF THE INVENTION

A method for reducing the parasitic capacitance and capacitive coupling of dielectrically isolated nodes in an integrated circuit using layout changes is disclosed herein. An inner area of floating silicon is created adjacent to one or more nodes. In one embodiment, two or more nodes are chosen that "slew together" (i.e., nodes that are required to change by approximately the same voltage at the approximately same time). The inner area of floating silicon is created by placing an additional trench around the one or more nodes.

An advantage of the invention is providing a method of reducing the parasitic capacitance of a node in dielectrically isolated technologies.

A further advantage of the invention is providing a method of reducing the capacitive coupling between nodes of a circuit.

These and other advantages will be apparent to those of ordinary skill in the art having reference to the specification in conjunction with the drawings.

DETAILED DESCRIPTION OF THE EMBODIMENTS

The invention will now be described in conjunction with reducing the effect of substrate capacitance in dielectrically isolated process technologies. Dielectrically isolated process technologies are beneficial for integrated circuits that, for example, have high operating speeds (e.g., in the GHz range).

Figure 2:
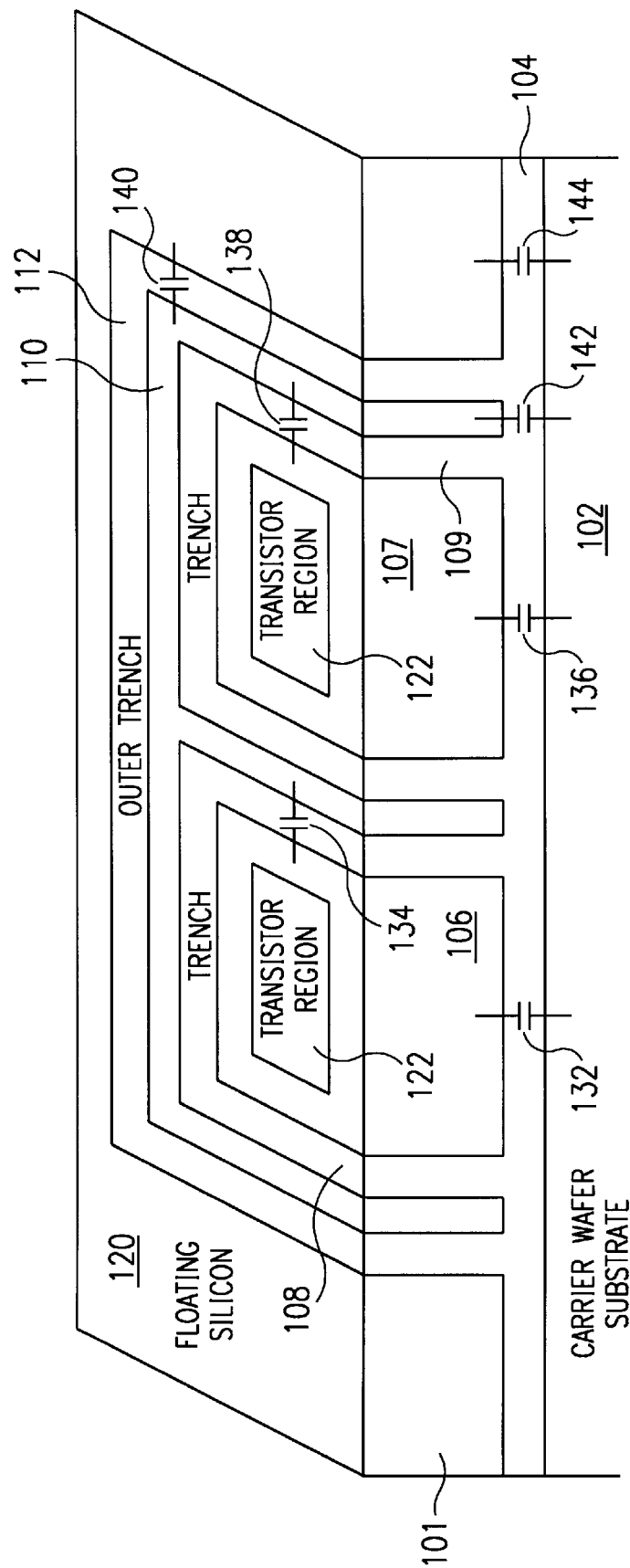
FIG. 2 is a cross-sectional diagram of a dielectrically isolated nodes according to the preferred embodiment of the invention.

A preferred embodiment of the invention is shown in FIG. 2. Device layer 101 is separated from the carrier wafer substrate 102 by buried dielectric layer 104. Dielectric layer 104 typically comprises silicon dioxide and may be on the order of 1 micron thick. Carrier wafer substrate 102 is conventionally silicon but may comprise other semiconducting substrate materials known in the art.

Nodes 106 and 107 are dielectrically isolated portions of silicon layer 101. They are isolated from floating silicon region 120 by first trenches 108 and 109 and second trench 112. Isolating trenches such as first trenches 108 and 109 are known in the art. As an example, they may contain a silicon dioxide sidewall layer and a polysilicon fill layer. Although varying the dielectric thickness in the trench will change the parasitic capacitance across the trench, this option is generally not available to the circuit designer. A transistor is located in each of the transistor regions 122 of nodes 106 and 107. Typically the transistor formed in each of the transistor regions 122 will be a bipolar transistor.

This embodiment of the invention may be used when there are several nodes of a circuit that slew together (i.e., are required to change by approximately the same voltage at approximately the same time). For example, in an amplifier, several nodes of the amplifier are often required to slew together. Nodes 106 and 107 contain transistors with collector terminals that slew together. Therefore, they are both placed within an additional trench 112. This creates a portion of floating silicon 110 within additional trench 112 that slews with nodes 106 and 107. Transistors in the regions enclosed by nodes 106 and 107 work together to charge and discharge the capacitance associated with the floating silicon 110.

The capacitances involved are: (1) the parasitic capacitance 132 between node 106 and the carrier substrate 102; (2) the coupling capacitance 134 between the nodes 106 and the floating silicon 110; (3) the parasitic capacitance 136 between node 107 and the carrier substrate 102; (4) the coupling capacitance 138 between the nodes 107 and the floating silicon 110; (5) the coupling capacitance 140 (of second trench 112) between the inner floating silicon 110 and the outer floating silicon 120; (6) the capacitance 142 between the inner floating silicon 110 and the carrier substrate 102 and (7) the capacitance 144 between the outer floating silicon 120 and the carrier substrate 102.

The outer floating silicon 120 is connected to AC ground. This connection keeps other transistors of other nodes (not shown) from having their parasitic capacitances charged or discharged by the transistors in nodes 106 and 107 that slew together. This technique is equivalent to substrate grounding in a junction isolated process. As a result, capacitance 144 from the outer floating silicon 120 to the carrier substrate can be neglected in all calculations.

This solution takes advantage of the fact that parasitic capacitances between devices that slew together can be ignored. The parasitic capacitances between devices that do not slew together are reduced by placing devices that slew together in a double trench and tying the outer floating silicon to AC ground. Hence the devices that slew in different directions see capacitances tied to AC ground and not to other devices that move in opposite directions. This means that the most detrimental parasitic capacitances can be reduced with only minimal increases in die size.

While FIG. 2 shows only two nodes 106,107 within additional trench 112, more than two nodes can be placed within trench 112 as long as the nodes all slew together. Also, multiple trenches 112 may be used, each around a different set of nodes that slew together.

Figure 3:
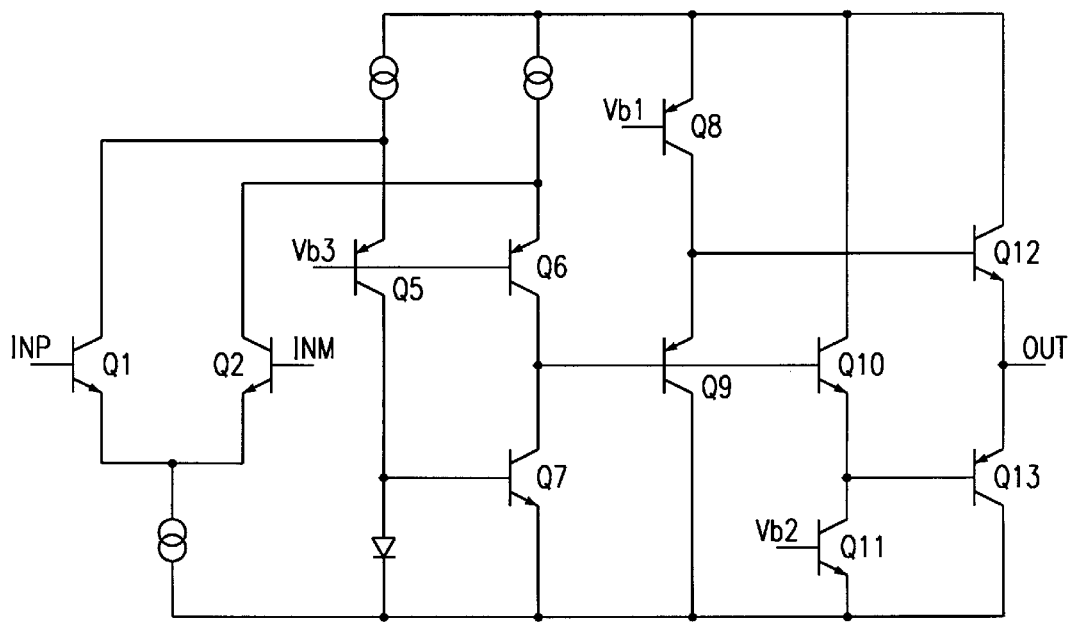
FIG. 3 is a schematic diagram of a circuit to which the teachings of the preferred embodiment can be applied.

To further explain the invention, the teachings of the above embodiment will now be applied to a circuit shown in FIG. 3. In the circuit of FIG. 3, the collectors of transistors Q6 and Q7 are electrically connected. Therefore, their collectors slew together. The collectors of transistors Q8 and Q11 are each separated from the collectors of transistors Q6 and Q7 by a base-emitter junction. The collector of transistor Q8 is separated from the collector of transistors Q6 and Q7 by the base-emitter junction of transistor Q9 and transistor Q11 is separated from the collector of transistors Q6 and Q7 by the base-emitter junction of transistor Q10. The base-emitter junction voltages of transistors Q9 and Q10 will remain essentially constant when compared with a slewing collector node, so the collectors of the four transistors (Q6, Q7, Q8, Q11) will slew together.

Figure 4:
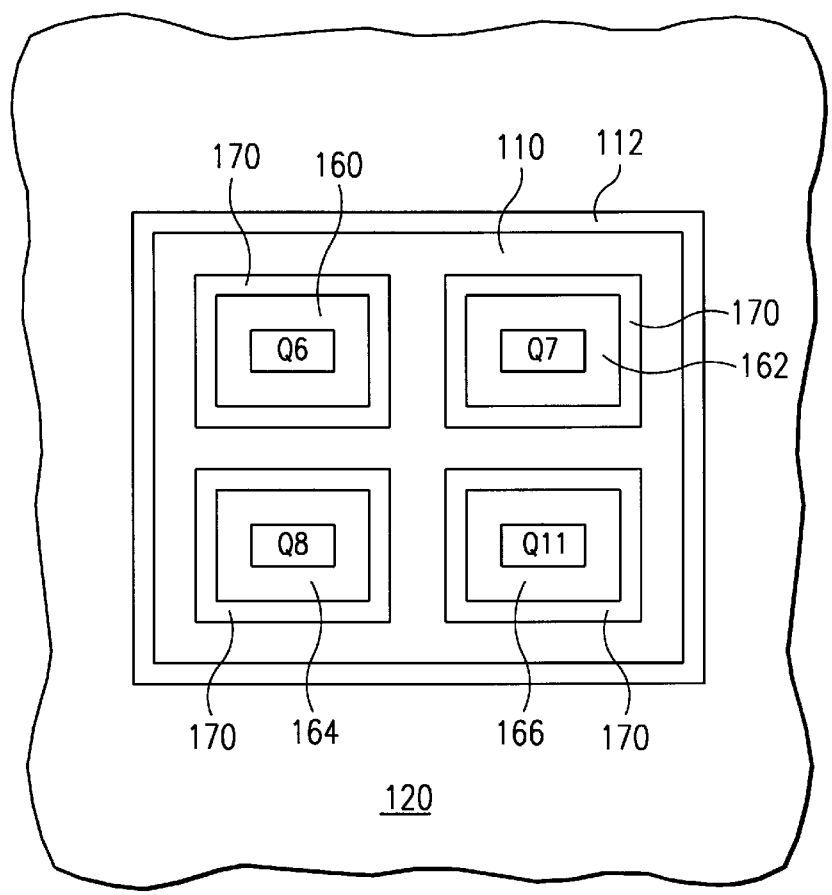
FIG. 4 is a top view of several nodes of the circuit of FIG. 3 to which the preferred embodiment has been applied.

FIG. 4 is a top view of this embodiment of the invention applied to transistors Q6, Q7, Q8, and Q11. Nodes 160, 162, 164, and 166 are each surrounded by a first trench 170. Transistors Q6, Q7, Q8, and Q11 are formed in nodes 160, 162,164, and 166, respectively. Second trench 112 surrounds first trench 170 forming inner floating silicon portion 110. Second trench 112 surrounds the four transistors Q6, Q7, Q8, and Q11 that slew together. Inner floating silicon 110 slews with nodes 160,162,164, and 166. Transistors Q6, Q7, Q8, and Q11 work together to charge and discharge the capacitance associated with the floating silicon 110.

Figure 5:
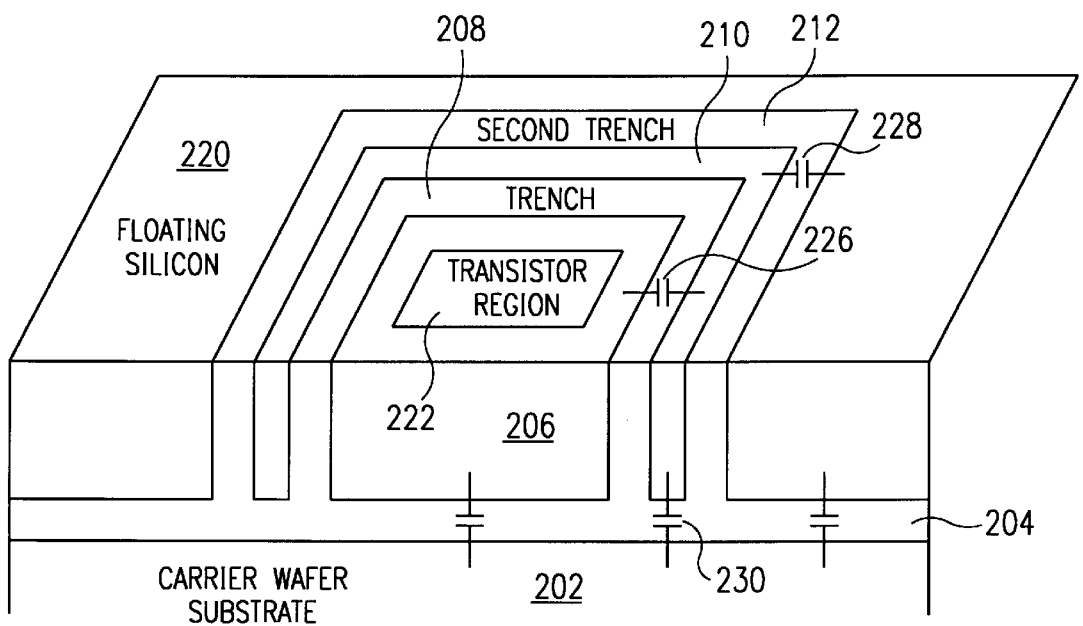
FIG. 5 is a cross-sectional diagram of a dielectrically isolated node according to a second embodiment of the invention.

Another embodiment of the invention is shown in FIG. 5. This embodiment may be used alone or in conjunction with the first embodiment for nodes that do not slew together. As in the first embodiment, a node 206 is separated from the carrier wafer substrate 202 by buried dielectric layer 204. Node 206 is a dielectrically isolated portion of silicon containing a transistor region 222. It is isolated from other nodes (not shown), floating silicon region 220 and the carrier wafer substrate 202.

Node 206 is surrounded by a first trench 208. Surrounding first trench 208 is second trench 212. First trench 208 and second trench 212 are filled with dielectric material(s). For example, they may contain a silicon dioxide sidewall layer and a polysilicon fill. The area between the first trench 208 and the second trench 212 is a region of inner floating silicon 210.

The above structure reduces the coupling capacitance to the outer floating silicon region 220. The capacitance from a collector region of a bipolar transistor formed in transistor region 222 to the outer floating silicon 220 is now two capacitors in series (226, 228). The first capacitance 226 is between the node and the inner floating silicon 210. The second capacitance is between the inner floating silicon 210 and the outer floating silicon 220. If these capacitors have approximately the same value, the new capacitance will be about half of the previous value.

This embodiment of capacitance reduction increases the area consumed by every transistor/node. Successive trenches can be added at the expense of greater area consumption. Plus, for every ring of floating silicon 210 around the node 206, there is a parasitic capacitance 230 to the carrier substrate. This parasitic capacitance 230 to the carrier substrate gets larger with each ring. Therefore, each new trench accomplishes less parasitic reduction.

Figure 1:
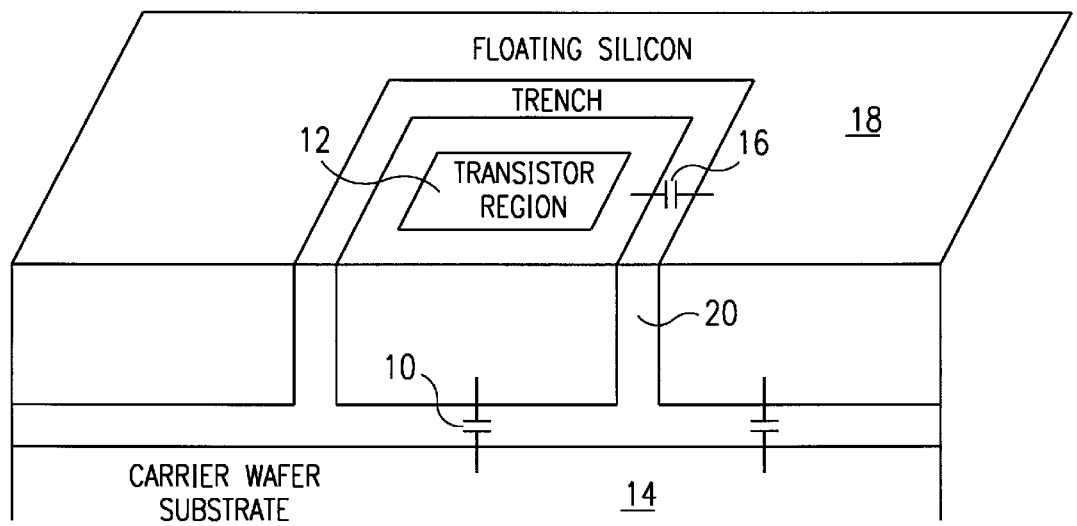
FIG. 1 is a cross-sectional diagram of a prior art dielectrically isolated technology.
Figure 6A:
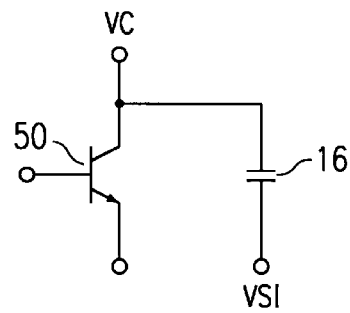
FIGS. 6A–6C are schematic diagrams of circuits associated with the structures of FIGS. 1, 5 and 2, respectively.

An equivalent circuit for the prior art single trench approach is shown in FIG. 6A. Transistor 50 is a bipolar transistor which is located in the transistor region 12 of FIG. 1. For this analysis, it is assumed that $V_{si}$ (floating silicon 18) is connected to ground and the capacitance 10 between the transistor 50 and the carrier substrate 14 is ignored because it remains constant and adds to the capacitance being changed. The capacitance 16 between the transistor 50 and the floating silicon 18 of FIG. 1 limits the speed of transistor 50.

Figure 6B:
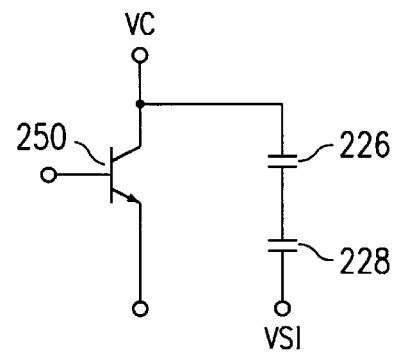

An equivalent circuit for the double trench approach of FIG. 5 is shown in FIG. 6B. Transistor 250 is a bipolar transistor located in transistor region 222 of FIG. 5. Instead of a single capacitance, transistor 250 drives two capacitances in series, 226 and 228. The total capacitance to be driven is thus less than that of FIG. 6A.

Figure 6C:
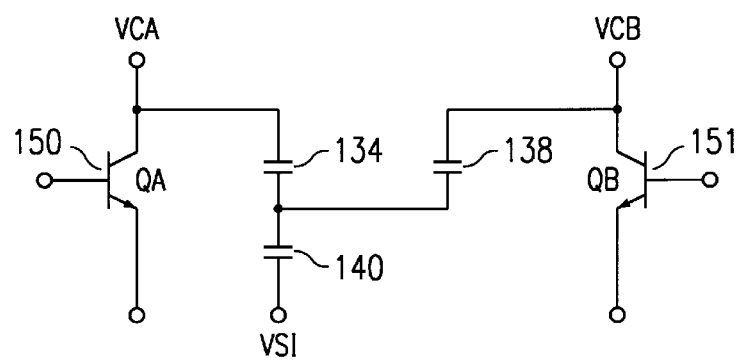

An equivalent circuit for the approach of FIG. 2 where the outer trench surrounds two or more nodes that slew together is shown in FIG. 6C. Here, transistor 150 drives capacitance 134 and part of capacitance 140 and transistor 151 drives capacitance 138 and part of capacitance 140. The capacitances 140 and 142 of FIG. 2 are in parallel and are shown in FIG. 6C as capacitance 140.

Figure 7:
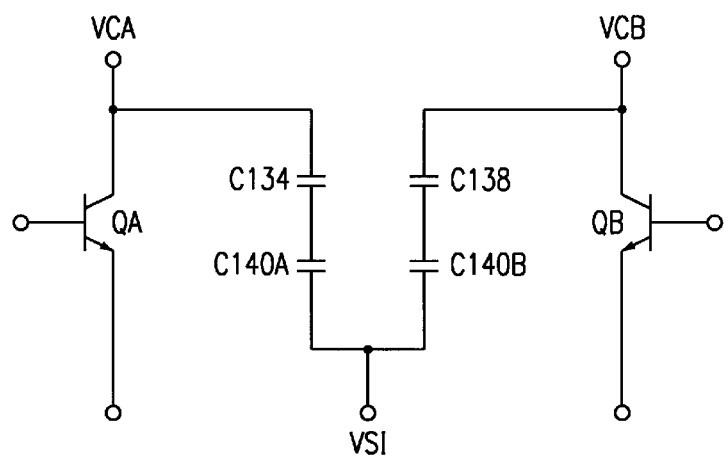
FIG. 7 is another schematic diagram associated with the structure of FIG. 2.

If the area enclosed by trenches 108 and 109 is approximately equal, the parallel capacitance of capacitors 140 and 142 (shown as C140 in FIG. 6C) can be divided evenly between the two transistors, resulting in the circuit shown in FIG. 7. This equivalent circuit can be compared to that of FIG. 6B, corresponding to the embodiment of FIG. 5. The capacitances C226 and C134 in FIGS. 6B and 7, respectively, will be equal. C228 in FIG. 6B is the parallel combination of C228 and C230 in FIG. 5, and C140A in FIG. 7 is the parallel combination of C140 and C142 in FIG. 2. C140 will be less than twice C228, and C142 will be less than twice C230. Thus the transistor in FIG. 7 will have less parasitic capacitance to drive than the one in FIG. 6B.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a plurality of dielectrically isolated silicon nodes each comprising a transistor region;
   a plurality of first trenches, each of said first trenches surrounding and isolating one of said plurality of dielectrically isolated silicon nodes; and
   at least one second trench, each said second trench surrounding at least two of said first trenches thereby creating an area of inner floating silicon around at least two of said dielectrically isolated silicon nodes.

2. The integrated circuit of claim 1, further comprising an outer silicon region connected to ground, said outer silicon region located around said second trench.

3. The integrated circuit of claim 1, wherein at least two of said dielectrically isolated silicon nodes contain bipolar transistors whose collectors are designed to slew together.

4. An integrated circuit comprising:
   a carrier substrate;
   a buried dielectric layer over said carrier substrate; and
   a device layer over said buried dielectric layer, said device layer comprising:
      an outer floating silicon region;
      a first transistor region surrounded by a first trench;
      a second transistor region surrounded by a second trench;
      a third trench surrounding said first and second trenches thereby creating an inner floating silicon region, wherein said first transistor region is separated from said outer floating silicon region by said first trench, said third trench, and said inner floating silicon region, and wherein said second transistor region is separated from said outer floating silicon region by said second trench, said third trench, and said inner floating silicon region.

5. The integrated circuit of claim 4, wherein said outer floating silicon region is connected to ground.

6. The integrated circuit of claim 4, further comprising:
   a plurality of said first transistor regions each surrounded by one of a plurality of said first trenches;
   a plurality of said second transistor regions each surrounded by one of a plurality of said second trenches; and
   a plurality of said third trenches, each surrounding at least one of said first transistor regions and at least one of said second transistor regions.

7. The integrated circuit of claim 4, wherein said first transistor region comprises a first bipolar transistor and said second transistor region comprises a second bipolar transistor, wherein the collectors of said first and second bipolar transistors slew together.

8. The integrated circuit of claim 7, further comprising:
   one or more third transistor regions each comprising a third bipolar transistor whose collector slews with said first and second bipolar transistors and each surrounded by a fourth trench, wherein said third trench and said inner floating silicon region surrounds said fourth trench.

9. An integrated circuit comprising:
   a carrier substrate;
   a buried dielectric layer over said carrier substrate; and
   a device layer over said buried dielectric layer, said device layer comprising:
      an outer floating silicon region;
      a first transistor region surrounded by a first trench;
      a second trench surrounding said first trench thereby creating an inner floating silicon region, wherein said first transistor region is separated from to said outer floating silicon region by said first and second trenches and said inner floating silicon region.

10. The integrated circuit of claim 9, further comprising one or more third trenches surrounding said second trench.

11. The integrated circuit of claim 9, further comprising:
    a plurality of said first transistor regions each surrounded by one of a plurality of said first trenches; and
    a plurality of said second trenches, each surrounding one of said plurality of first trenches.

* * * * *